United States Patent
Zou

(10) Patent No.: US 12,520,675 B2
(45) Date of Patent: Jan. 6, 2026

(54) DISPLAY PANEL AND DISPLAY APPARATUS HAVING AT LEAST ONE LIGHT ADJUSTMENT LAYER

(71) Applicant: Wuhan Tianma Microelectronics Co., Ltd., Wuhan (CN)

(72) Inventor: Yang Zou, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 461 days.

(21) Appl. No.: 18/078,208

(22) Filed: Dec. 9, 2022

(65) Prior Publication Data

US 2023/0105200 A1    Apr. 6, 2023

(30) Foreign Application Priority Data

Sep. 2, 2022    (CN) .......................... 202211073350.1

(51) Int. Cl.
*H10K 59/12*  (2023.01)
*H10K 59/124*  (2023.01)
*H10K 59/80*  (2023.01)

(52) U.S. Cl.
CPC .......... *H10K 59/124* (2023.02); *H10K 59/879* (2023.02)

(58) Field of Classification Search
CPC ........................... H10K 59/124; H10K 50/858

USPC .......................................................... 257/71
See application file for complete search history.

(56) References Cited

FOREIGN PATENT DOCUMENTS

| CN | 103972266 A | 8/2014 | |
|---|---|---|---|
| CN | 108807479 A | 11/2018 | |
| CN | 110770911 A | 2/2020 | |
| CN | 111223912 B | * 8/2022 | ......... H01L 27/3232 |

OTHER PUBLICATIONS

Cite the machine translation Fang X (CN-111223912-B).*

* cited by examiner

*Primary Examiner* — Phuc T Dang
(74) *Attorney, Agent, or Firm* — KDW FIRM PLLC

(57) ABSTRACT

Provided are a display panel and a display apparatus. The display panel includes a first display region and a second display region. The light transmittance of the first display region is greater than the light transmittance of the second display region. The display panel also includes a substrate and at least one light adjustment layer disposed on one side of the substrate. Each light adjustment layer includes a first light adjustment layer and a second light adjustment layer. The first light adjustment layer is disposed on the side of the second light adjustment layer facing away from the substrate. The refractive index of the first light adjustment layer is greater than the refractive index of the second light adjustment layer.

17 Claims, 13 Drawing Sheets

--Prior Art--

# DISPLAY PANEL AND DISPLAY APPARATUS HAVING AT LEAST ONE LIGHT ADJUSTMENT LAYER

CROSS-REFERENCE TO RELATED APPLICATION(S)

This application claims priority to Chinese Patent Application No. 202211073350.1 filed Sep. 2, 2022, the disclosure of which is incorporated herein by reference in its entirety.

TECHNICAL FIELD

The present disclosure relates to the field of display technologies and, in particular, to a display panel and a display apparatus.

BACKGROUND

In an existing display apparatus, in order to juggle optical functions and full-screen display, a display panel generally includes a normal display region and a photosensitive region. The light transmittance of the photosensitive region is greater than the light transmittance of other normal display regions by adjusting the subpixel density of the photosensitive region to implement optical functions such as fingerprint recognition and front-facing camera shooting. At the same time, since the photosensitive region also has a display function, and thus the full-screen display can be implemented.

A subpixel includes a light emission element and a pixel driver circuit used for driving the light emission element to emit light. The pixel driver circuit generally includes thin-film transistors. The thin-film transistor is sensitive to light and the problem such as threshold voltage drift may occur in the thin-film transistor after thin-film transistor is exposed to light. According to the research, the light intensity of a thin-film transistor in the photosensitive region and the light intensity of a thin-film transistor in the normal display region are quite different, resulting in different degrees of drifts in characteristics of thin-film transistors in different regions and affecting the display uniformity.

SUMMARY

The present disclosure provides a display panel and a display apparatus to improve display uniformity and juggle optical functions at the same time.

In one aspect, the embodiments of the present disclosure provide a display panel. The display panel includes a first display region and a second display region. The light transmittance of the first display region is greater than the light transmittance of the second display region.

The display panel also includes a substrate and at least one light adjustment layer disposed on one side of the substrate.

Each light adjustment layer includes a first light adjustment layer and a second light adjustment layer. The first light adjustment layer is disposed on the side of the second light adjustment layer facing away from the substrate. The refractive index of the first light adjustment layer is greater than the refractive index of the second light adjustment layer.

In another aspect, the embodiments of the present disclosure provide a display apparatus. The display apparatus includes a photosensitive element and the display panel in any embodiment of the present disclosure.

The photosensitive element is disposed corresponding to a first display region.

According to the technical solutions in the embodiments of the present disclosure, at least one light adjustment layer is disposed on one side of the substrate. Each light adjustment layer includes a first light adjustment layer having a higher refractive index and a second light adjustment layer having a lower refractive index. The first light adjustment layer is disposed on the side of the second light adjustment layer facing away from the substrate. Thus, the reflectance of the light at the interface between the first light adjustment layer and the second light adjustment layer can be appropriately increased, and the light intensity emitting to one side of the substrate can be reduced. Moreover, the light intensity reflected to a thin-film transistor is reduced, the degree of drifts in characteristics of the thin-film transistor is reduced, and the display uniformity is improved. At the same time, the light adjustment layer having a certain light transmittance can be ensured, thereby meeting the requirement of the first display region for the light transmittance and implementing both the optical functions and the display effect.

It is to be understood that the contents described in this part are not intended to identify key or important features of the embodiments of the present disclosure and are not intended to limit the scope of the present disclosure. Other features of the present disclosure become readily understood through the description hereinafter.

BRIEF DESCRIPTION OF DRAWINGS

To illustrate technical solutions in the embodiments of the present disclosure more clearly, drawings used in description of the embodiments are briefly described below. Apparently, the drawings described below merely illustrate part of the embodiments of the present disclosure, and those of ordinary skill in the art may obtain other drawings based on the drawings on the premise that no creative work is done.

DETAILED DESCRIPTION

The technical solutions in the embodiments of the present disclosure are described clearly and completely in conjunction with the drawings in the embodiments of the present disclosure from which the solutions of the present disclosure are better understood by those skilled in the art. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

Light propagation generally exists inside a display apparatus, such as the incidence of ambient light and the refraction and reflection of the ambient light inside the display apparatus or the refraction and reflection of light emitted by a light emission element in a subpixel inside the display apparatus. According to the research the light intensity of a thin-film transistor in a photosensitive region and the light intensity of a thin-film transistor in a normal display region are different, resulting in different degrees of drifts in characteristics of thin-film transistors in different regions, thereby affecting the display uniformity.

Figure 1:
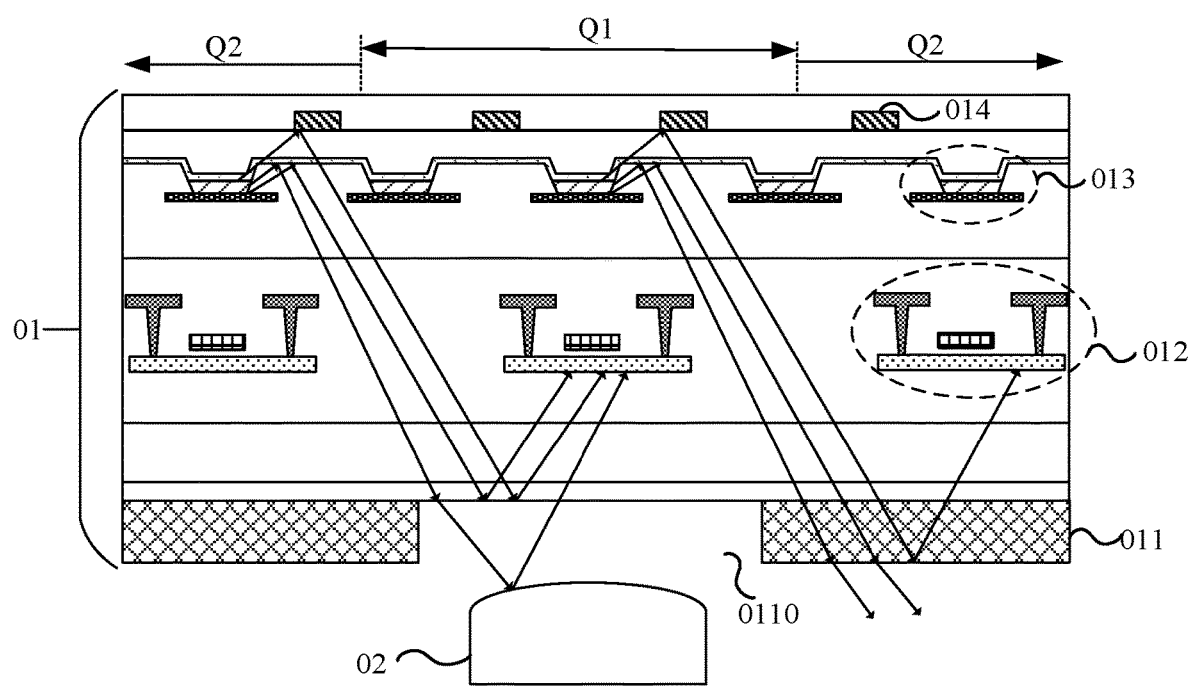
FIG. 1 is a diagram illustrating the structure of an existing display apparatus.

Exemplarily, FIG. 1 is a diagram illustrating the structure of an existing display apparatus. As shown in FIG. 1, the display apparatus includes a display panel 01 and a photosensitive element 02. The display panel 01 includes a photosensitive region Q1 and a normal display region Q2. The photosensitive element 02 is disposed corresponding to the photosensitive region Q1. From bottom to top, the display panel 01 sequentially includes a support layer 011, a pixel circuit layer in which thin-film transistors 012 are disposed, a light emission unit layer in which light emission elements 013 are disposed, and a touch layer in which touch electrodes 014 are disposed. The support layer 011 is provided with a light-passing hole 0110 corresponding to the photosensitive region Q1 to ensure reception of light by the photosensitive element 02. For optical paths as shown in FIG. 1, part of light emitted from the light emission elements 013 propagates toward the side of the support layer 011 under the reflection action of structures such as the touch electrodes 014. In the photosensitive region Q1, since the refractive index of air is small, the refractive index difference between the air and the film layer above the support layer 011 is relatively large, so most of the light is reflected at the interface between the air and the film layer above the support layer 011 and emitted to the thin-film transistor 012 in the photosensitive region Q1. In addition, a small part of the light may be reflected again after being emitted to the photosensitive element 02. The small part of the light enters the display panel 01 and is emitted to the thin-film transistor 012 in the photosensitive region Q1. Therefore, the light intensity of the thin-film transistor 012 in the photosensitive region Q1 is relatively large. In the normal display region Q2, since the refractive index of the support layer 011 is relatively greater than that of air, the refractive index difference between the support layer 011 and the film layer above the support layer 011 is relatively small. Therefore, most of the light can pass through the support layer 011 and emit out of the display panel. Only a small part of the light is reflected to the thin-film transistors 012 in the normal display region Q2. Therefore, the light intensity of the thin-film transistors 012 in the normal display region Q2 is relatively small. Since the light intensity of the thin-film transistor in the photosensitive region Q1 is greater than the light intensity of the thin-film transistors in the normal display region Q2, the degree of drifts in characteristics of the thin-film transistor in the photosensitive region Q1 is more serious. Thus, a phenomenon such as a white mass or a black mass occurs in the photosensitive region Q1, affecting the display uniformity.

In the related art, a light-shielding layer is disposed between light emission elements 013 and a support layer 011 to reduce the light intensity reaching one side of the support layer 011, thereby reducing the light intensity reflected to thin-film transistors 012. However, in this solution, at least one mask and one technique process need to be added. This is time-consuming and cost-increasing. In addition, the light transmittance of the photosensitive region Q1 is seriously reduced, thereby affecting the normal optical functions such as fingerprint recognition or camera shooting.

To solve the preceding problems, the embodiments of the present disclosure provide a display panel. The display panel includes a first display region and a second display region. The light transmittance of the first display region is greater than the light transmittance of the second display region. The display panel also includes a substrate and at least one light adjustment layer disposed on one side of the substrate. Each light adjustment layer includes a first light adjustment layer and a second light adjustment layer. The first light adjustment layer is disposed on the side of the second light adjustment layer facing away from the substrate. The refractive index of the first light adjustment layer is greater than the refractive index of the second light adjustment layer.

With the preceding solutions, the first light adjustment layer is disposed on the side of the second light adjustment layer facing away from the substrate, and the refractive index of the first light adjustment layer is greater than the refractive index of the second light adjustment layer. Thus, the reflectance of the light at the interface between the first light adjustment layer and the second light adjustment layer can be appropriately increased, and the light intensity emitted to one side of the substrate can be reduced. Moreover, the light intensity reflected to thin-film transistors is reduced, the degrees of drifts in characteristics of the thin-film transistors are reduced, and the display uniformity is improved. At the same time, the light adjustment layer having a certain light transmittance can be ensured, thereby meeting the requirement of the first display region for the light transmittance and implementing both the optical functions and the display effect.

The preceding is the core idea of the present disclosure. Based on the embodiments of the present disclosure, all other embodiments obtained by those of ordinary skill in the art are within the scope of the present disclosure on the premise that no creative work is done. The technical solutions in the embodiments of the present disclosure are described clearly and completely hereinafter in conjunction with the drawings in the embodiments of the present disclosure.

Figure 2:
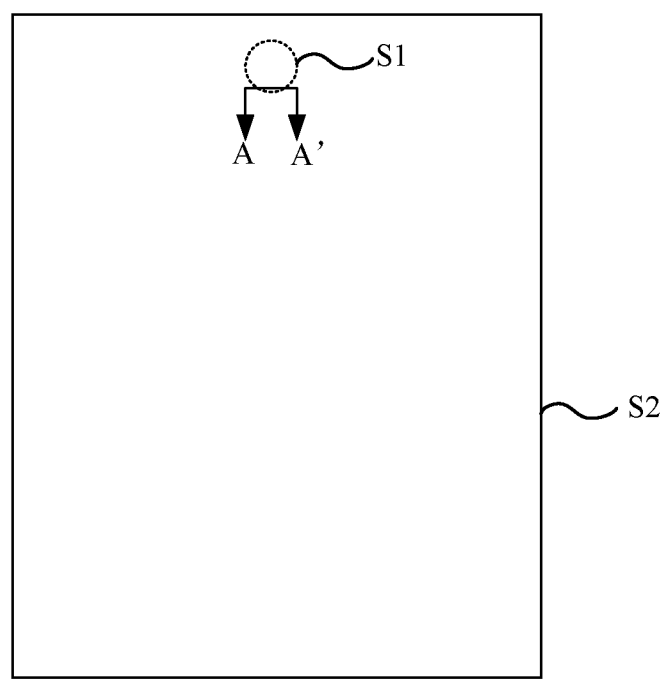
FIG. 2 is a top view illustrating the structure of a display panel according to the embodiments of the present disclosure.
Figure 3:
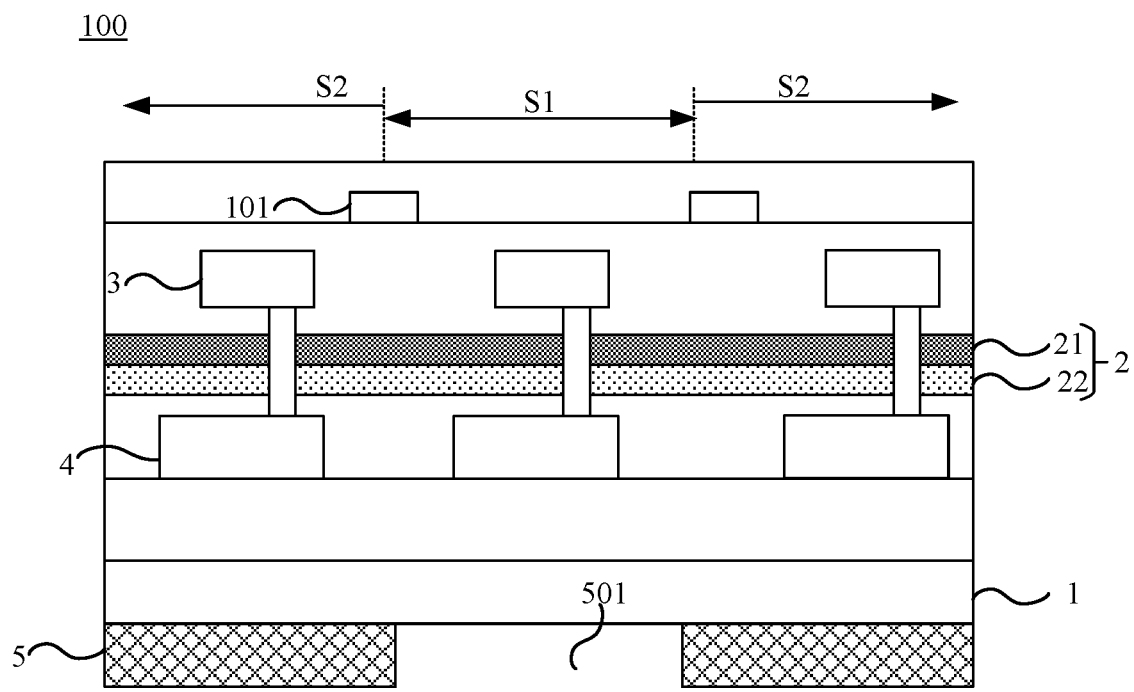
FIG. 3 is a cross-sectional view illustrating the structure of a display panel taken along AA' in FIG. 2.

FIG. 2 is a top view illustrating the structure of a display panel according to the embodiments of the present disclosure. FIG. 3 is a cross-sectional view illustrating the structure of a display panel taken along AA' in FIG. 2. As shown in FIG. 2 and FIG. 3, a display panel 100 includes a first display region S1 and a second display region S2. The light transmittance of the first display region S1 is greater than the light transmittance of the second display region S2. The display panel 100 also includes a substrate 1 and at least one light adjustment layer 2 disposed on one side of the substrate 1. Each light adjustment layer 2 includes a first light adjustment layer 21 and a second light adjustment layer 22. The first light adjustment layer 21 is disposed on the side of the second light adjustment layer 22 facing away from the substrate 1. The refractive index of the first light adjustment layer 21 is greater than the refractive index of the second light adjustment layer 22.

In this embodiment, each of the first display region S1 and the second display region S2 includes subpixels. The light transmittance of the first display region S1 is greater than the light transmittance of the second display region S2. Thus, the first display region S1 can be used for display to implement full-screen display and used for implementing optical functions such as fingerprint recognition or front-facing camera shooting. Accordingly, the first display region S1 may be a camera region or a fingerprint recognition region.

Optionally, the light transmittance of the first display region S1 can be greater than the light transmittance of the second display region S2 by reducing the density of subpixels in the first display region S1. Specifically, the sizes of subpixels in the first display region S1 may be set to be equal to the sizes of corresponding subpixels in the second display region S2. The light transmittance of the first display region S1 can be increased by reducing the number of subpixels per unit area. In other embodiments, the number of subpixels per unit area in the first display region S1 may be set to be equal to the number of subpixels per unit area in the second display region S2. The light transmittance of the first display region S1 can be increased by reducing the sizes of the subpixels. Of course, the preceding embodiments are only examples. Those skilled in the art may use any other known manner to implement that the light transmittance of the first display region S1 is greater than the light transmittance of the second display region S2. No special limitations are made thereto in the embodiments of the present disclosure.

It is to be noted that the relative position relationship between the first display region S1 and the second display region S2 in FIG. 2 is only for illustration, not limitation. Those skilled in the art may set the size and position of the first display region S1 according to actual requirements of the optical functions to be implemented by the first display region S1. No limitations are made thereto in the embodiments of the present disclosure.

As shown in FIG. 3, in this embodiment, a light adjustment layer 2 is disposed on one side of the substrate 1. The light adjustment layer 2 includes the first light adjustment layer 21 and the second light adjustment layer 22. The first light adjustment layer 21 is disposed on the side of the second light adjustment layer 22 facing away from the substrate 1. The refractive index of the first light adjustment layer 21 is greater than the refractive index of the second light adjustment layer 22. Assuming that the refractive index of the first light adjustment layer 21 is n1 and the refractive index of the second light adjustment layer 22 is n2, the reflectance at the interface between the first light adjustment layer 21 and the second light adjustment layer 22 can be known from the reflectance formula $R=[(n1-n2)/(n1+n2)]^2$. It can be seen from this formula that the reflectance of the light at the interface between the first light adjustment layer 21 and the second light adjustment layer 22 can be adjusted by adjusting the refractive index difference between the first light adjustment layer 21 and the second light adjustment layer 22. In this manner, the refractive index difference between the first light adjustment layer 21 and the second light adjustment layer 22 can be reasonably set according to actual reflectance and transmittance requirements to ensure that the light adjustment layer 2 has a certain light transmittance and increase the reflectance of the light at the interface between the first light adjustment layer 21 and the second light adjustment layer 22 at the same time. Thus, the light intensity emitted to thin-film transistors is reduced, the degrees of drifts in characteristics of the thin-film transistors are reduced, and the display uniformity is improved. At the same time, the requirement of the first display region S1 for the light transmittance is ensured, and the display effect and optical functions are taken into account.

Optionally, the light adjustment layer 2 is disposed on the side of a first side of a thin-film transistor facing away from the substrate 1. The first side of the thin-film transistor may be understood as the side of the thin-film transistor closest to the substrate 1. In this manner, it is possible to prevent light from being reflected by the light adjustment layer 2 to the thin-film transistor. This is more conducive to reducing the light intensity emitted to the thin-film transistor, reducing the degree of drifts in characteristics of the thin-film transistor, and improving the display uniformity.

It is to be noted that FIG. 3 only takes the display panel 100 including one light adjustment layer 2 as an example for illustration. This arrangement is not limited thereto. In other embodiments, optionally, a display panel 100 includes multiple light adjustment layers 2. In this case, the reflectance of the light in the process of being emitted to one side of a substrate 1 can be increased through the multiple light adjustment layers 2, further reducing the light intensity emitted to one side of the substrate 1. Thus, the light intensity emitted to thin-film transistors is reduced, the degrees of drifts in characteristics of the thin-film transistors are reduced, and the display uniformity is improved.

It is to be noted that the first light adjustment layer 21 and the second light adjustment layer 22 can be prepared by selecting materials with a required refractive index difference known to those skilled in the art. No limitations are made thereto in the embodiments of the present disclosure.

In summary, in this embodiment of the present disclosure, at least one light adjustment layer is disposed on one side of the substrate. The light adjustment layer includes a first light adjustment layer having a higher refractive index and a second light adjustment layer having a lower refractive index. The first light adjustment layer is disposed on the side of the second light adjustment layer facing away from the substrate. Thus, the reflectance of the light at the interface between the first light adjustment layer and the second light adjustment layer can be appropriately increased, and the light intensity emitted to one side of the substrate can be reduced. Moreover, the light intensity reflected to thin-film transistors is reduced, the degrees of drifts in characteristics of the thin-film transistors are reduced, and the display uniformity is improved. At the same time, the light adjustment layer having a certain light transmittance can be ensured, thereby meeting the requirement of the first display region for the light transmittance and implementing both the optical functions and the display effect.

Figure 4:
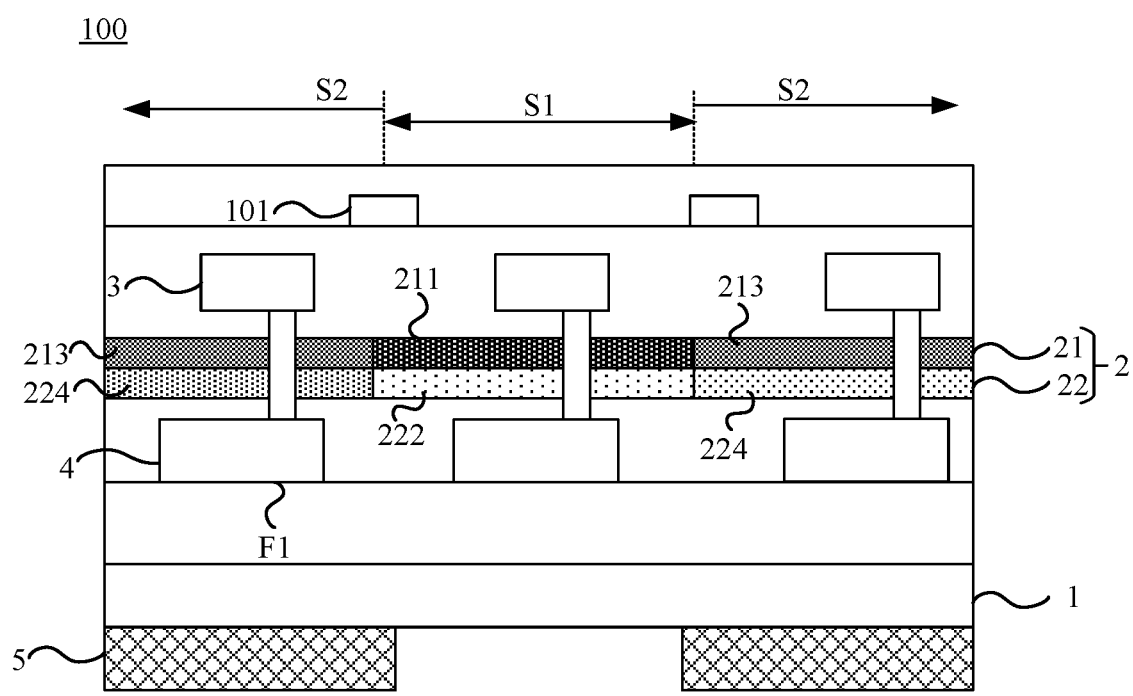
FIG. 4 is a cross-sectional view illustrating the structure of another display panel taken along AA' in FIG. 2.

On the basis of the preceding embodiments, FIG. 4 is a cross-sectional view illustrating the structure of another display panel taken along AA' in FIG. 2. As shown in FIG. 4, optionally, a first light adjustment layer 21 includes a first light emitting segment 211 disposed in a first display region S1 and third light emitting segments 213 disposed in a second display region S2. A second light adjustment layer 22 includes a second light emitting segment 222 disposed in the first display region S1 and fourth light emitting segments 224 disposed in the second display region S2. The refractive index difference between the first light emitting segment 211 and the second light emitting segment 222 is greater than the refractive index difference between the third light emitting segments 213 and the fourth light emitting segments 224.

In the preceding embodiments, the refractive index of the first light adjustment layer 21 facing away from one side of the substrate 1 is greater than the refractive index of the second light adjustment layer 22 facing one side of the substrate 1 so that the light intensity reaching the substrate 1 can be reduced. Further, the light intensity reaching thin-film transistors can be reduced, the degrees of drifts in characteristics of the thin-film transistors can be reduced, and the display uniformity can be improved to a certain extent (since the degrees of drifts in characteristics of the thin-film transistors are small, the display difference between the first display region S1 and the second display region S2 cannot be easily recognized by human eyes). Further, in this embodiment, the first light adjustment layer 21 is divided into the first light emitting segment 211 in the first display region S1 and the third light emitting segments 213 in the second display region S2. The second light adjustment layer 22 is divided into the second light emitting segment 222 in the first display region S1 and the fourth light emitting segments 224 in the second display region S2. The refractive index difference between the first light emitting segment 211 and the second light emitting segment 222 is greater than the refractive index difference between the third light emitting segments 213 and the fourth light emitting segments 224 so that the reflectance of the light at the interface between the first light emitting segment 211 and the second light emitting segment 222 is greater than the reflectance of the light at the interface between the third light emitting segments 213 and the fourth light emitting segments 224. Thus, the light intensity irradiated to thin-film transistors in the first display region S1 can be further reduced, the difference between the degrees of drifts in characteristics of thin-film transistors in the first display region S1 and the degrees of drifts in characteristics of thin-film transistors in the second display region S2 can be further reduced, and the display uniformity can be further improved.

Of course, it is to be noted that, on the premise that the light transmittance meets the requirements, the refractive index of the first light adjustment layer 21 in each region may be set to be equal, and the refractive index of the second light adjustment layer 22 in each region may be set to be equal. The display uniformity is improved by appropriately increasing the refractive index difference between the first light adjustment layer 21 and the second light adjustment layer 22. In this manner, the difficulty in process implementation is relatively lower.

As shown in FIG. 3 or FIG. 4, optionally, the display panel 100 also includes a light emission unit layer (for example, a film layer in which light emission elements 3 are disposed) and a touch layer (for example, a film layer in which touch electrodes 101 are disposed) which are disposed on the side of the light adjustment layer 2 facing away from the substrate 1. The light emission unit layer includes multiple light emission elements 3. The touch layer includes multiple touch electrodes 101. The orthographic projections of the touch electrodes 101 on the substrate 1 do not overlap the orthographic projections of the light emission elements 3 on the substrate 1. The touch electrodes 101 are not light-transmissive.

By configuring the touch layer in the display panel to cooperate with corresponding peripheral circuits, the display apparatus can have a touch function, thereby improving the intelligence of the display apparatus. The touch electrodes 101 in the touch layer may be designed according to specific touch modes (for example, self-capacitive touch and mutual capacitive touch). No limitations are made thereto in the embodiments of the present disclosure. Since the touch electrodes 101 are not light-transmissive, and the touch layer is disposed on the side of the light emission unit layer facing away from the substrate 1, part of light emitted from the light emission elements 3 may be emitted to one side of the substrate 1 under the reflection action of touch electrodes 101. In this embodiment, the preceding light adjustment layer 2 is disposed to reduce the light intensity irradiated to one side of the substrate 1, thereby reducing the light intensity reflected to thin-film transistors and improving the display uniformity.

As shown in FIG. 3, optionally, the display panel 100 also includes a support layer 5 disposed on the side of the substrate 1 facing away from the light adjustment layer 2. The support layer 5 includes a light-passing hole 501. The orthographic projection of the light-passing hole 501 on the substrate 1 overlaps the orthographic projection of the first display region S1 on the substrate 1. The support layer 5 is disposed on the side of the substrate 1 facing away from the light adjustment layer 2 and mainly plays the role of heat dissipation and shielding interference. By disposing the light-passing hole 501 corresponding to the first display region S1 in the support layer 5, the loss of light intensity in the first display region S1 can be reduced, and the normal operation of the optical functions can be ensured. Exemplarily, the support layer 5 may use composite foam. The composite foam may be composed of materials such as copper foil, optically clear adhesive (OCA), graphite, and foam.

On the basis of the preceding embodiments, the arrangement of the light adjustment layer 2 is further explained below.

Optionally, the first light adjustment layer 21 and the second light adjustment layer 22 are inorganic insulation layers. Insulation layers include inorganic insulation layers and organic insulation layers. In the preparation process of display panels, the organic insulation layers used by most panel manufacturers in the preparation of display panels require specialized suppliers to provide finished products. Therefore, to regulate the refractive indices of the organic insulation layers, it is necessary to provide the refractive index requirements for the suppliers, and the suppliers design the corresponding organic insulation layers. Thus, the design difficulty is increased, and the cost is increased. In contrast, the inorganic insulation layers may be prepared independently by using a physical vapor deposition manner or the like. The refractive indices of the inorganic insulation layers can be regulated by adjusting the gas flux or the gas ratio during the preparation process. Therefore, the preparation of the first light adjustment layer and the second light adjustment layer by using the inorganic insulation layers makes the process simpler and the cost lower.

Optionally, the material of the first light adjustment layer 21 is silicon nitride, and the material of the second light adjustment layer 22 is silicon oxide. The refractive index of the silicon nitride is greater than the refractive index of the silicon oxide. Therefore, the material of the first light adjustment layer 21 and the material of the second light adjustment layer 22 are silicon nitride and silicon oxide, respectively. Thus, the refractive index of the first light adjustment layer 21 and the refractive index of the second light adjustment layer 22 are more easily regulated, and the process difficulty is further reduced. In addition, the silicon nitride and the silicon oxide are inorganic insulation layers commonly used in display panels. Therefore, the material of the first light adjustment layer 21 and the material of the second light adjustment layer 22 are silicon nitride and silicon oxide, respectively, so that the adaptation of the first light adjustment layer 21 and the second light adjustment layer 22 to the original internal structure of a display panel is better.

As shown in FIG. 3, the display panel 100 also includes a pixel circuit layer (for example, a film layer in which pixel driver circuits 4 are located) and a light emission unit layer (for example, a film layer in which light emission elements 3 are located). The pixel circuit layer is disposed between the substrate 1 and the light emission unit layer. The pixel circuit layer includes pixel driver circuits 4. The light emission unit layer includes light emission elements 3. The pixel driver circuits 4 are used for driving the light emission elements 3 to emit light. The pixel circuit layer and the light emission unit layer each includes at least one insulation layer. Optionally, two adjacent insulation layers are reused as the first light adjustment layer 21 and the second light adjustment layer 22 in a one-to-one manner along the direction perpendicular to a plane in which the substrate 1 is located.

The two existing adjacent insulation layers are reused as the first light adjustment layer 21 and the second light adjustment layer 22 in a one-to-one manner to avoid an additional increase in the number of film layers of the display panel and facilitate the thin design of the display panel. In addition, the insulation layers are reused as the first light adjustment layer 21 and the second light adjustment layer 22. In this manner, by adjusting the refractive indices of the insulation layers and the reflectance of the light adjustment layer 2 to the light emitted to one side of the substrate 1, the degrees of drifts in characteristics of thin-film transistors are reduced, and the display uniformity is improved. Compared with the manner in which the film layers where circuit elements in a display panel are disposed are reused as the first light adjustment layer 21 or the second light adjustment layer 22, this manner does not need to change parameters such as the composition of the film layers where the circuit elements are disposed. Therefore, it is possible to avoid affecting the characteristics of the circuit elements inside the display panel.

It is to be understood that the specific film layer structures of display panels corresponding to different pixel driver circuits 4 are different. The arrangement of the light adjustment layer 2 is illustrated exemplarily with reference to the specific pixel driver circuit 4 below.

Figure 5:
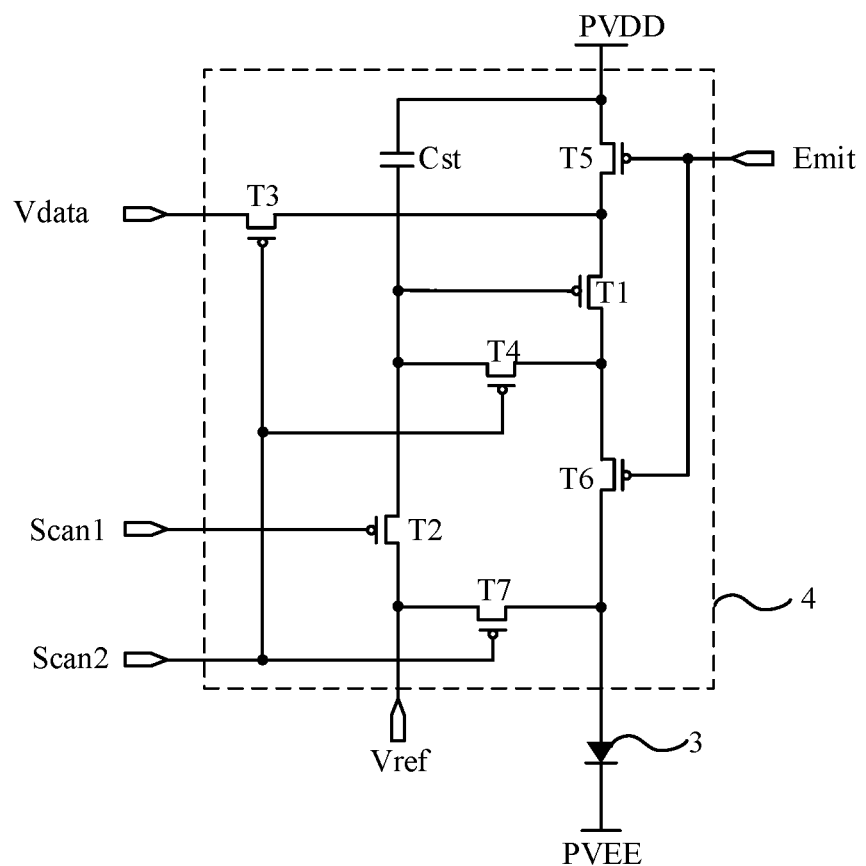
FIG. 5 is a diagram illustrating a circuit principle of a subpixel in a display panel according to the embodiments of the present disclosure.
Figure 6:
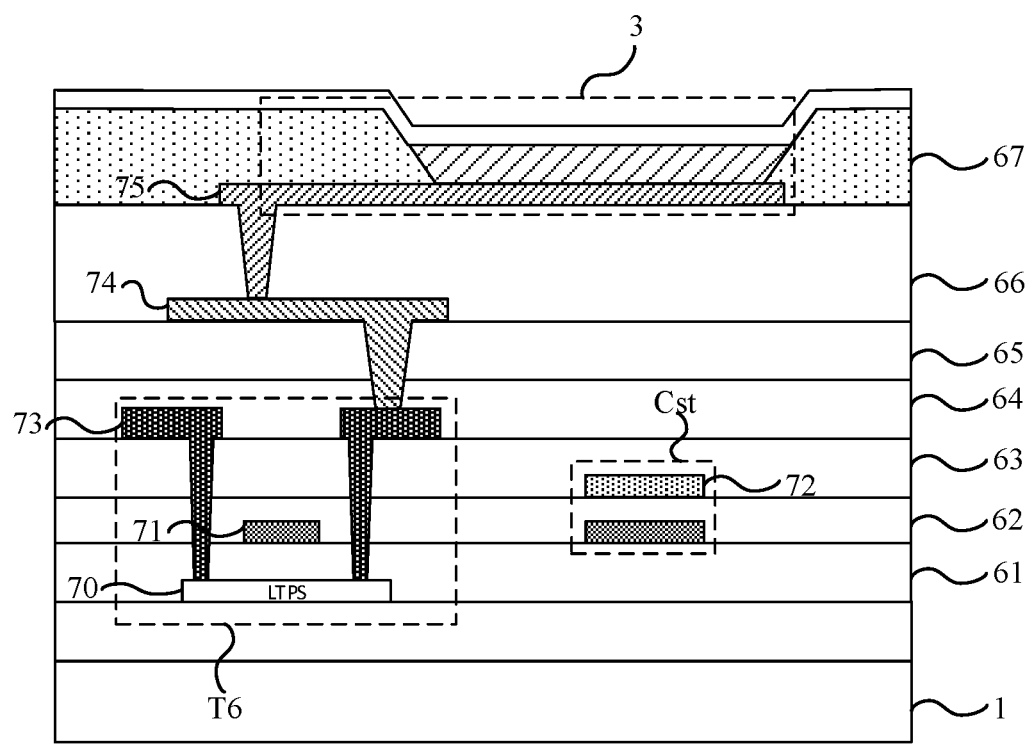
FIG. 6 is a partial cross-sectional view illustrating the structure of a display panel corresponding to FIG. 5.

As a feasible embodiment, FIG. 5 is a diagram illustrating a circuit principle of a subpixel in a display panel according to the embodiments of the present disclosure. FIG. 6 is a partial cross-sectional view illustrating the structure of a display panel corresponding to FIG. 5. As shown in FIG. 5 and FIG. 6, optionally, a pixel driver circuit 4 includes at least two thin-film transistors (for example, T1 to T6). Each thin-film transistor includes a polysilicon active layer 70.

Taking an organic light-emitting diode display panel as an example, a light emission element 3 is an organic light-emitting diode. The pixel driver circuit of the light emission element 3 is generally composed of several thin-film transistors (TFTs) and storage capacitors (Csts). Currently, a commonly used pixel driver circuit includes a 7T1C (that is, 7 thin-film transistors and 1 storage capacitor) pixel driver circuit. FIG. 5 shows a 7T1C pixel driver circuit and an electrical connection relationship between the 7T1C pixel driver circuit and a light emission element 3.

It is to be understood that the film layer structure of the display panel varies with the type of thin-film transistor in the pixel driver circuit 4. As shown in FIG. 5, in this embodiment, the types of thin-film transistors are the same, and each thin-film transistor includes a polysilicon active layer. In this case, the same structure of each thin-film transistor is disposed on the same film layer. FIG. 6 only takes the section structure of a thin-film transistor T6 as an example for illustration. Exemplarily, each thin-film transistor may be a low-temperature polycrystalline silicon (LTPS) transistor. Such a transistor has the advantages of high switching speed, high carrier mobility, and low power consumption. This is conducive to reducing the power consumption of the pixel driver circuit 4 and shortening the response time of the pixel driver circuit 4.

Figure 7:
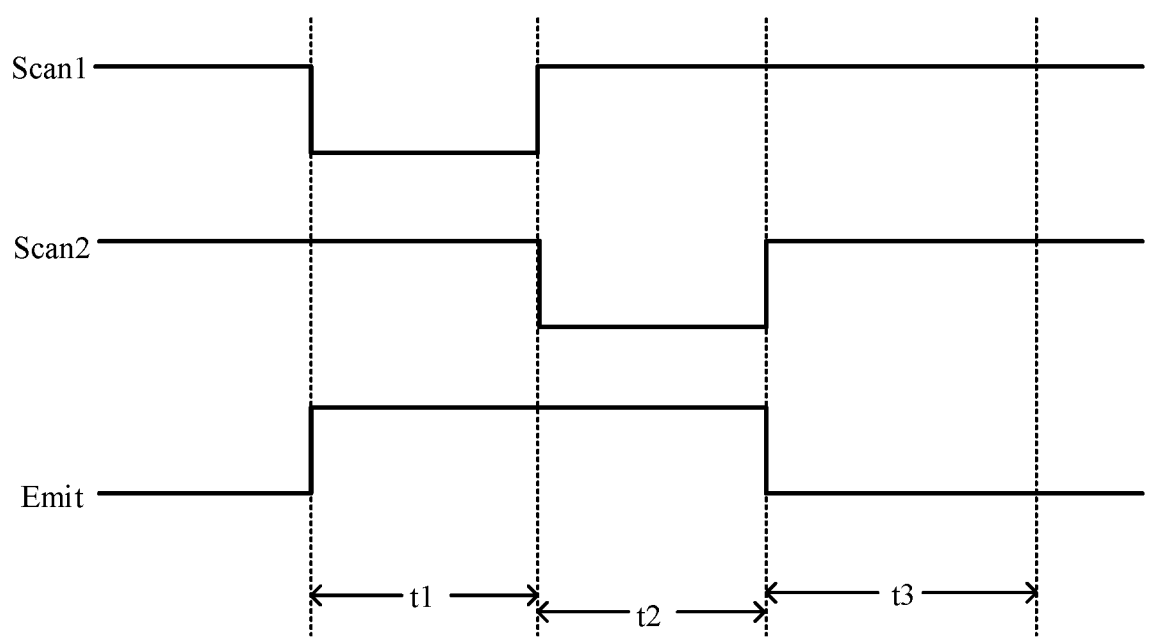
FIG. 7 is a drive timing graph of a pixel driver circuit corresponding to FIG. 5.

FIG. 7 is a drive timing graph of a pixel driver circuit corresponding to FIG. 5. The driving process of the pixel driver circuit 4 is described below with reference to FIG. 5 and FIG. 7. Referring to FIG. 5 and FIG. 7, the driving process of the pixel driver circuit 4 includes an initialization stage t1, a data write stage t2, and a light emission stage t3. Specifically, at the initialization stage t1, an initialization transistor T2 is turned on under the control of the first scan control signal sent by a first scan control signal terminal Scan1. Thus, the initialization signal of an initialization signal terminal Vref is written into the gate of a driver transistor T1 to initialize the gate of the driver transistor. At the data write stage t2, a data write transistor T3 and a threshold compensation transistor T4 are turned on under the control of the second scan control signal sent by a second scan control signal terminal Scan2. At the same time, the driver transistor T1 is turned on because a gate-source voltage meets the on condition. Thus, the data write transistor T3 writes the data signal of a data signal terminal into the gate of the driver transistor T1. The threshold compensation transistor T4 drives the gate of the transistor T1 with the threshold voltage compensation value of the driver transistor T1. In addition, at the data write stage t2, a reset transistor T7 can be turned on under the control of the second scan control signal sent by the second scan control signal terminal Scan2. The initialization signal of the initialization signal terminal Vref is written into the anode of the organic light-emitting diode (3). The anode voltage of the organic light-emitting diode is reset. At the light emission stage t3, a first light emission control transistor T5 and a second light emission control transistor T6 are turned on under the control of the light emission control signal of a light emission control signal terminal Emit. Since a storage capacitor Cst stores the gate potential of the driver transistor T1 so that the driver transistor T1 generates a drive current based on the gate potential and the potential of a first power signal terminal PVDD to drive the organic light-emitting diode to emit light. In FIG. 5, PVEE is a second power signal terminal. The potential of the second power signal terminal is less than the potential of the first power signal terminal.

As shown in FIG. 6, when each of the thin-film transistors includes a polysilicon active layer, along the direction in which the substrate 1 points toward the light emission element 3, the display panel includes a gate insulation layer 61, a first interlayer insulation layer 62, a second interlayer insulation layer 63, a protection insulation layer 64, a first planarization layer 65, a second planarization layer 66, and a pixel defining layer 67 disposed in sequence on one side of the substrate 1. Optionally, two adjacently disposed layers of the following layers are reused as the first light adjustment layer 21 and the second light adjustment layer 22 in a one-to-one manner: the gate insulation layer 61, the first interlayer insulation layer 62, the second interlayer insulation layer 63, the protection insulation layer 64, the first planarization layer 65, the second planarization layer 66, and the pixel defining layer 67. This arrangement can avoid an additional increase in the number of film layers of the display panel and facilitate the thin design of the display panel.

Still referring to FIG. 6, the display panel also includes a first metal layer 71, a capacitor plate layer 72, a second metal layer 73, a third metal layer 74, and an anode metal layer 75 which are disposed on one side of the substrate 1. The specific positions of the preceding insulation layers are as follows. The gate insulation layer 61 is disposed between the polysilicon active layer 70 and the first metal layer 71. The first interlayer insulation layer 62 is disposed between the first metal layer 71 and the capacitor plate layer 72. The second interlayer insulation layer 63 is disposed between the capacitor plate layer 72 and the second metal layer 73. The protection insulation layer 64 and the first planarization layer 65 are disposed between the second metal layer 73 and the third metal layer 74. The second planarization layer 66 is disposed between the third metal layer 74 and the anode metal layer 75. The pixel defining layer 67 is disposed on the side of the anode metal layer 75 facing away from the substrate 1. Specifically, as shown in FIG. 6, in this embodiment, the first metal layer 71 may form the gate of a thin-film transistor (for example, T6) and the lower plate of a storage capacitor Cst. The capacitor plate layer 72 may form the upper plate of the storage capacitor Cst. The second metal layer 73 may form the source and drain of a thin-film transistor (for example, T6). The source and drain of the thin-film transistor are in contact with the polysilicon active layer 70 through a via. The anode metal layer 75 may form the anode of the light emission element 3. The third metal layer 74 may form a connection structure between the anode and the thin-film transistor.

In the preceding insulation layers, the gate insulation layer 61, the first interlayer insulation layer 62, the second interlayer insulation layer 63, and the protection insulation layer 64 are generally inorganic insulation layers. The first planarization layer 65, the second planarization layer 66, and the pixel defining layer 67 are generally organic insulation layers. As can be seen from the preceding description, the inorganic insulation layers, that is, two adjacently disposed layers of the gate insulation layer 61, the first interlayer insulation layer 62, the second interlayer insulation layer 63, and the protection insulation layer 64 may be reused as the first light adjustment layer 21 and the second light adjustment layer 22. In this manner, the cost and the process difficulty can be reduced. Of course, an organic insulation layer may be reused as the first light adjustment layer 21 or the second light adjustment layer 22. No limitations are made thereto in the embodiments of the present disclosure.

In an embodiment, considering the factors such as the bonding between film layers and the refractive indices of film layers, optionally, the preceding inorganic insulation layers may be prepared by using a mixture of silicon oxide and silicon nitride. That is, the inorganic insulation layers include both silicon oxide and silicon nitride. The presence of silicon oxide is beneficial for ensuring the bonding between adjacent film layers. The presence of silicon nitride is beneficial for adjusting the refractive indices of film layers. Specifically, the refractive index of a film layer can be adjusted by adjusting the composition ratio of silicon oxide and silicon nitride in the film layer. The higher the ratio of silicon nitride in the film layer, the greater the refractive index of the film layer. The higher the ratio of silicon oxide in the film layer, the smaller the refractive index of the film layer.

Figure 8:
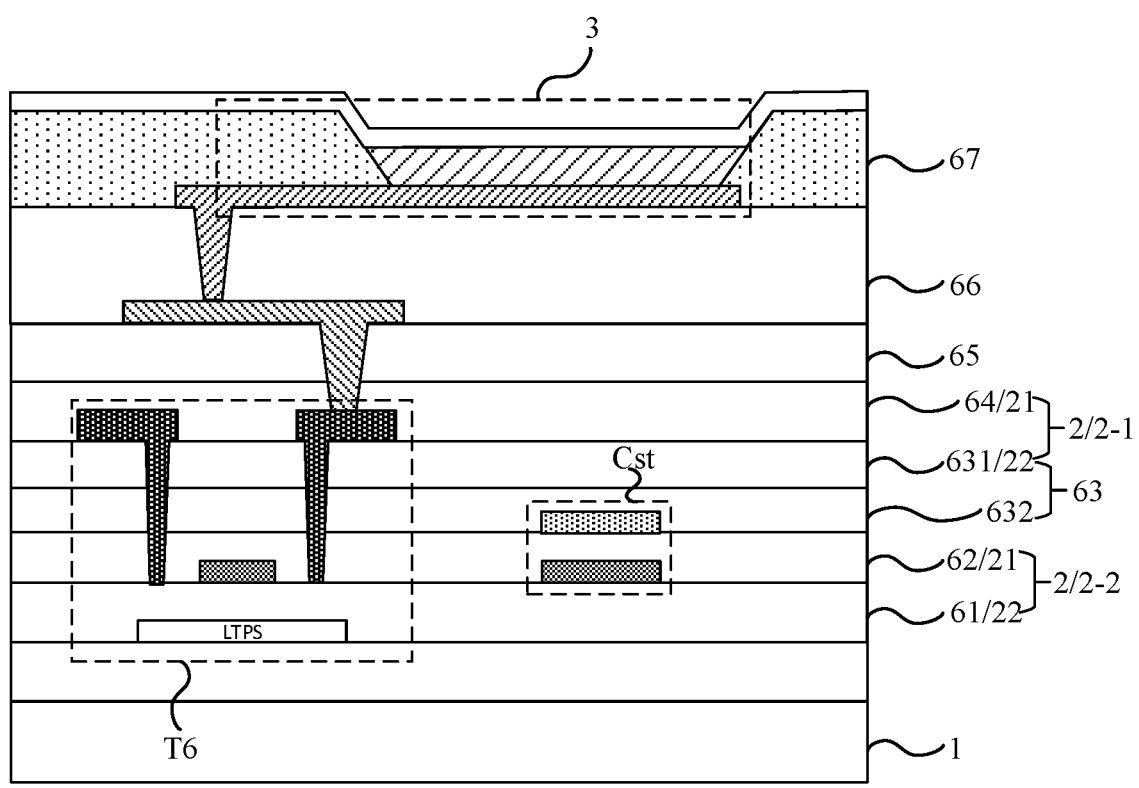
FIG. 8 is a partial cross-sectional view illustrating the structure of another display panel corresponding to FIG. 5.

FIG. 8 is a partial cross-sectional view illustrating the structure of another display panel corresponding to FIG. 5. As shown in FIG. 8, optionally, a second interlayer insulation layer 63 includes a first sub-interlayer insulation layer 631. The first sub-interlayer insulation layer 631 is disposed closest to a protection insulation layer 64. The protection insulation layer 64 is reused as a first light adjustment layer 21. The first sub-interlayer insulation layer 631 is reused as a second light adjustment layer 22. Moreover/alternatively, a first interlayer insulation layer 62 is reused as the first light adjustment layer 21, and a gate insulation layer 61 is reused as the second light adjustment layer 22.

Specifically, considering the factors such as the bonding between film layers and the refractive indices of film layers, in the preceding inorganic insulation layers, optionally, the ratio of silicon oxide in the gate insulation layer 61 is higher, the ratio of silicon nitride in the first interlayer insulation layer 62 is higher, the ratio of silicon oxide in the first sub-interlayer insulation layer 631 is higher, and the ratio of silicon nitride in the protection insulation layer 64 is higher. In this manner, in adjacent insulation layers, the refractive index of the protection insulation layer 64 is greater than the refractive index of the first sub-interlayer insulation layer 631, and the refractive index of the first interlayer insulation layer 62 is greater than the refractive index of the gate insulation layer 61. Thus, the protection insulation layer 64 and the first sub-interlayer insulation layer 631 can be reused as the first light adjustment layer 21 and the second light adjustment layer 22, respectively, to form one light adjustment layer 2. The first interlayer insulation layer 62 and the gate insulation layer 61 can also be reused as the first light adjustment layer 21 and the second light adjustment layer 22, respectively, to form one light adjustment layer 2. Thus, the display panel includes one or two light adjustment layers 2, such as a light adjustment layer 2-1 and a light adjustment layer 2-2 in FIG. 8. Those skilled in the art may select at least one of the light adjustment layers 2 according to requirements. By reasonably setting the refractive indices of the first light adjustment layer 21 and the second light adjustment layer 22 in the light adjustment layer 2, the light intensity irradiated to one side of the substrate 1 is reduced, thereby reducing the light intensity reflected to thin-film transistors and improving the display uniformity.

Exemplarily, Table 1 is taken as example of refractive indices of inorganic insulation layers provided in the embodiments of the present disclosure. As shown in Table 1, the second column data shows the refractive index value (hereinafter referred to as the reference refractive index value) of each insulation layer in a reference embodiment and the reflectance corresponding to the embodiment. In this case, the reflectance of the light adjustment layer 2 to the light is 38.61%. The third column data shows a feasible embodiment one of the present disclosure. Compared with the reference refractive index value of each insulation layer, in this embodiment, the refractive index of the protection insulation layer 64 is increased, and the refractive index of the first sub-interlayer insulation layer 631 is decreased. Thus, the reflectance of the light adjustment layer 2 to the light is increased to 44.10%, thereby reducing the light intensity emitted to one side of the substrate 1 to a certain extent. Moreover, the light intensity reflected to thin-film transistors is reduced, the degrees of drifts in characteristics of the thin-film transistors are reduced, and the display uniformity is improved. The fourth column of data shows a feasible embodiment two of the present disclosure. Compared with the reference refractive index of each insulation layer, in this embodiment, the refractive index of the first interlayer insulation layer 62 is increased, and the refractive index of the gate insulation layer 61 is decreased. Thus, the reflectance of the light adjustment layer 2 to the light is increased to 46.00%. The fifth column data shows a feasible embodiment three of the present disclosure. Compared with the reference refractive index of each insulation layer, in this embodiment, the refractive index of the protection insulation layer 64 is increased, and the refractive index of the first sub-interlayer insulation layer 631 is decreased. At the same time, the refractive index of the first interlayer insulation layer 62 is increased, and the refractive index of the gate insulation layer 61 is decreased. Thus, the reflectance of the light adjustment layer 2 to the light is increased to 48.9%, thereby further reducing the light intensity emitted to one side of the substrate 1 and further improving the display uniformity. It can be seen that by increasing the refractive index difference between the first light adjustment layer and the second light adjustment layer, the reflectance of the light adjustment layer to the light can be increased. The more the number of the light adjustment layers, the greater the reflectance of the light. This can further reduce the light intensity emitted to one side of the substrate.

TABLE 1

Example of refractive indices of inorganic insulation layers

| Refractive Index | Reference Embodiment | Embodiment One | Embodiment Two | Embodiment Three |
|---|---|---|---|---|
| Protection Insulation Layer | 1.948 | 1.958 | 1.948 | 1.958 |
| First Sub-interlayer Insulation Layer | 1.471 | 1.461 | 1.471 | 1.461 |
| First Interlayer Insulation Layer | 1.948 | 1.948 | 1.958 | 1.958 |
| Gate Insulation Layer | 1.471 | 1.471 | 1.461 | 1.461 |
| Reflectance | 38.61% | 44.10% | 46.00% | 48.90% |

Still referring to FIG. 8, optionally, the second interlayer insulation layer 63 also includes a second sub-interlayer insulation layer 632. The second sub-interlayer insulation layer 632 is disposed on the side of the first sub-interlayer insulation layer 631 facing the substrate 1. The refractive index of the second sub-interlayer insulation layer 632 is greater than the refractive index of the first sub-interlayer insulation layer 631. Considering the factors such as the bonding between film layers and the refractive indices of film layers, optionally, the ratio of silicon nitride in the second sub-interlayer insulation layer 632 is higher.

Figure 9:
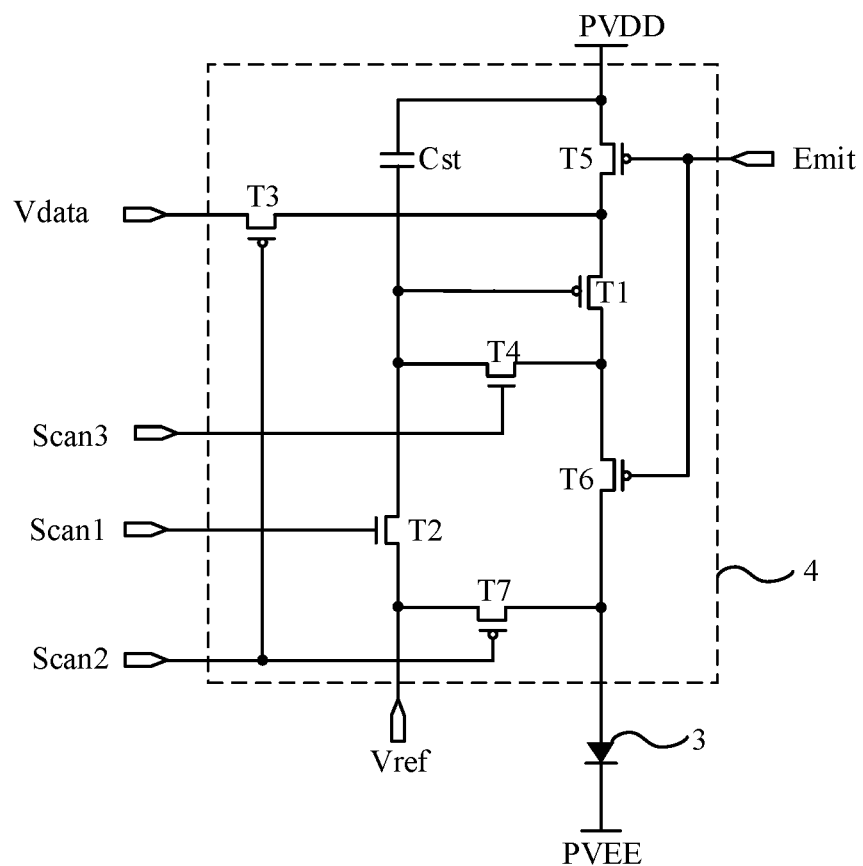
FIG. 9 is a diagram illustrating a circuit principle of another subpixel in a display panel according to the embodiments of the present disclosure.
Figure 10:
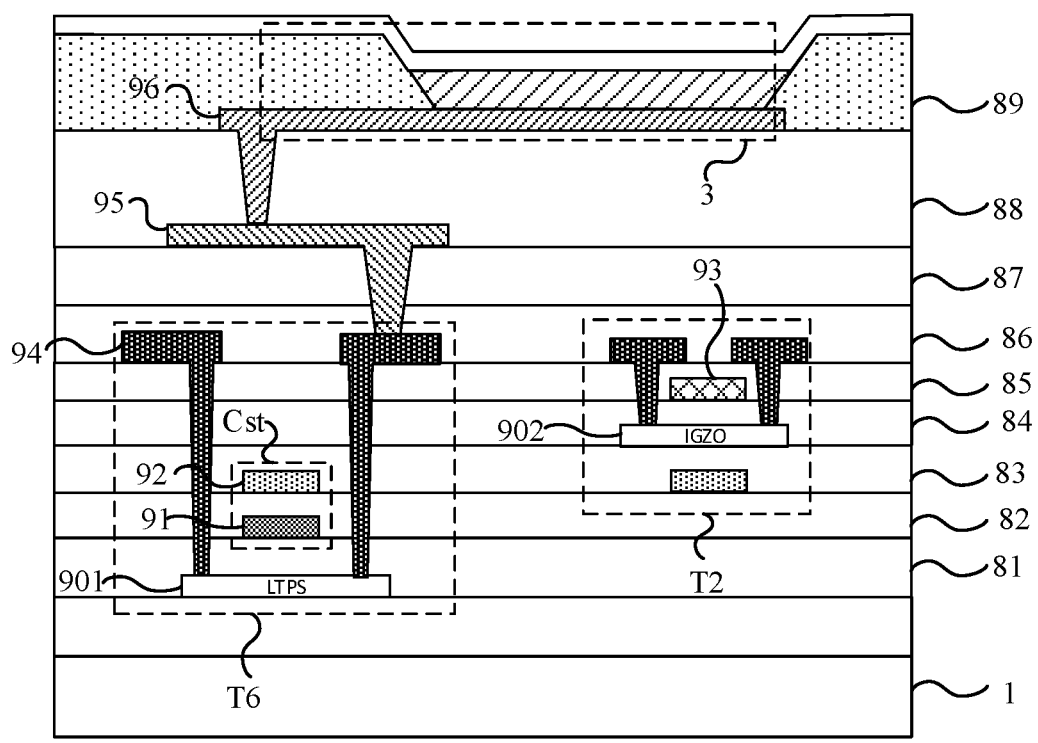
FIG. 10 is a partial cross-sectional view illustrating the structure of a display panel corresponding to FIG. 9.

As another feasible embodiment, FIG. 9 is a diagram illustrating a circuit principle of another subpixel in a display panel according to the embodiments of the present disclosure. FIG. 10 is a partial cross-sectional view illustrating the structure of a display panel corresponding to FIG. 9. As shown in FIG. 9 and FIG. 10, optionally, a pixel driver circuit 4 includes first-type thin-film transistors (for example, T6) and second-type thin-film transistors (for example, T2). Each first-type thin-film transistor includes a polysilicon active layer 901. Each second-type thin-film transistor includes an oxide semiconductor active layer 902. The pixel driver circuit 4 shown in FIG. 9 is still a 7T1C pixel driver circuit. FIG. 9 differs from FIG. 5 in that the pixel driver circuit 4 shown in FIG. 9 includes two different types of thin-film transistors. A driver transistor T1, a data write transistor T3, a first light emission control transistor T5, a second light emission control transistor T6, and a reset transistor T7 are first-type thin-film transistors. Such thin-film transistors include polysilicon active layers 901. An initialization transistor T2 and a threshold compensation transistor T4 are second-type thin-film transistors. Such thin-film transistors include oxide semiconductor active layers 902. FIG. 10 illustrates a section structure of two types of thin-film transistors using only the second light emission control transistor T6 and the initialization transistor T2 as an example. In this embodiment, by setting the pixel driver circuit 4 to include two types of thin-film transistors, different advantages of the two types of thin-film transistors can be brought into full play, and the excellent performance of the pixel driver circuit 4 can be ensured.

Exemplarily, as shown in FIG. 10, a first-type thin-film transistor (for example, T6) includes a polysilicon active layer 901. For example, the first-type thin-film transistor may be a low-temperature polycrystalline silicon (LTPS) transistor. Such a transistor has the advantages of high switching speed, high carrier mobility, and low power consumption. The second-type thin-film transistor (for example, T2) includes an oxide semiconductor active layer 902. For example, the second-type thin-film transistor may be an indium gallium zinc oxide (IGZO) transistor. Such a transistor has the advantages of simple preparation process and small leakage current. In this embodiment of the present disclosure, the pixel driver circuit 4 is set to include both the first-type thin-film transistor and the second-type thin-film transistor. Thus, a low-temperature polycrystalline oxide (LTPO) circuit is formed, the advantages of different transistors can be brought into full play, and the superior performance and high driving efficiency of the pixel driver circuit can be ensured.

Specifically, the driver transistor T1, the data write transistor T3, the first light emission control transistor T5, the second light emission control transistor T6, and the reset transistor T7 are set to be the first-type thin-film transistors, such as LTPS transistors, to reduce the power consumption of the pixel driver circuit 4 and shorten the response time of the pixel driver circuit 4. The initialization transistor T2 and the threshold compensation transistor T4 are set to be the second-type thin-film transistors, such as IGZO transistors, to reduce the leakage current of the initialization transistor T2 and threshold compensation transistor T4, thereby reducing the influence of the leakage current of the initialization transistor T2 and threshold compensation transistor T4 on the gate potential of the driver transistor T1, and further optimizing the performance of the pixel driver circuit 4.

Figure 11:
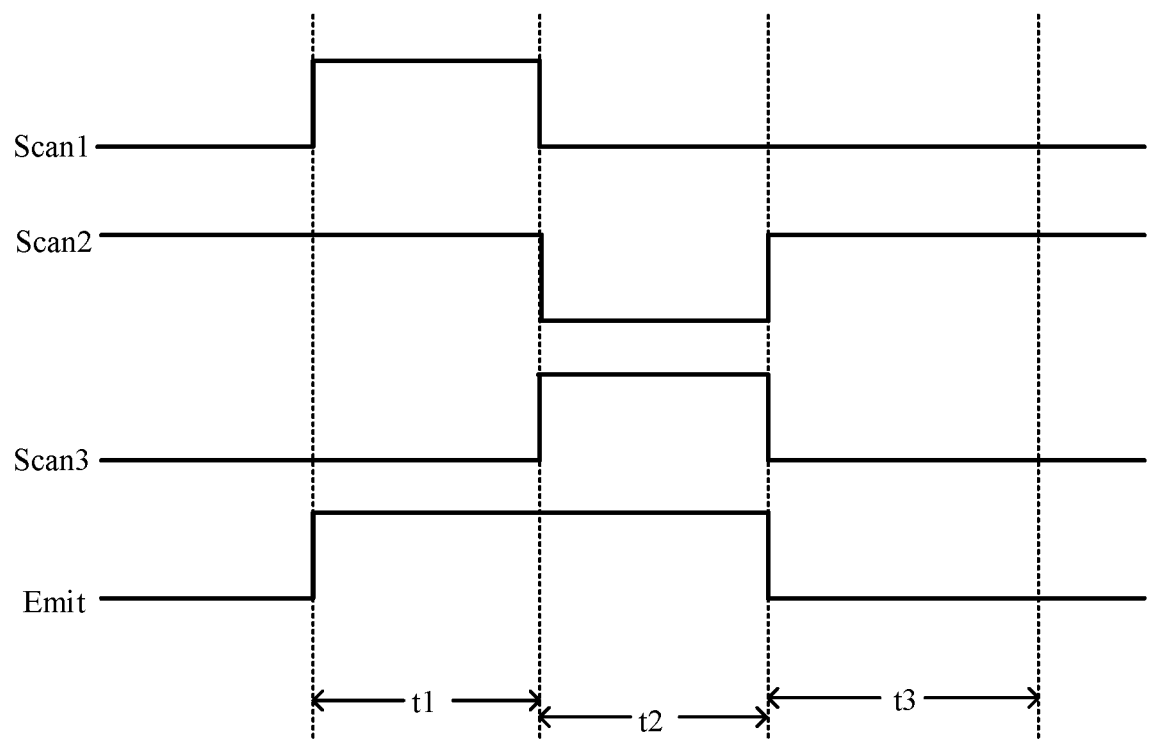
FIG. 11 is a drive timing graph of a pixel driver circuit corresponding to FIG. 9.

FIG. 11 is a drive timing graph of a pixel driver circuit corresponding to FIG. 9. As shown in FIG. 9 and FIG. 11, the driving process of the pixel driver circuit shown in FIG. 9 differs from the driving process of the pixel driver circuit shown in FIG. 5 in that the enable level of the initialization transistor T2 and the enable level of the threshold compensation transistor T4 are changed to high levels. Since the type of the data write transistor T3 and the type of the threshold compensation transistor T4 are different, the threshold compensation transistor T4 needs to be turned on under the control of the third scan control signal sent by a third scan control signal terminal Scan3 at the data write stage t2. The remaining similarities can be understood with reference to the related contents of FIG. 5 and FIG. 6, and details are not described herein.

As shown in FIG. 10, when the pixel driver circuit 4 includes two types of thin-film transistors, along the direction in which the substrate 1 points toward the light emission element 3, the display panel includes a first gate insulation layer 81, a first interlayer insulation layer 82, a second gate insulation layer 83, a third gate insulation layer 84, a second interlayer insulation layer 85, a protection insulation layer 86, a first planarization layer 87, a second planarization layer 88, and a pixel defining layer 89 disposed in sequence on one side of the substrate 1. Optionally, the first light adjustment layer 21 and the second light adjustment layer 22 are reused as two adjacently disposed layers of the following layers are reused as the first light adjustment layer 21 and the second light adjustment layer 22 in a one-to-one manner: the first gate insulation layer 81, the first interlayer insulation layer 82, the second gate insulation layer 83, the third gate insulation layer 84, the second interlayer insulation layer 85, the protection insulation layer 86, the first planarization layer 87, the second planarization layer 88, and the pixel defining layer 89. This arrangement can avoid an additional increase in the number of film layers of the display panel and facilitate the thin design of the display panel.

Still referring to FIG. 10, the display panel also includes a first metal layer 91, a capacitor plate layer 92, a top-gate metal layer 93, a second metal layer 94, a third metal layer 95, and an anode metal layer 96. The first gate insulation layer 81 is disposed between the polysilicon active layer 901 and the first metal layer 91. The first interlayer insulation layer 82 is disposed between the first metal layer 91 and the capacitor plate layer 92. The second gate insulation layer 83 is disposed between the capacitor plate layer 92 and the oxide semiconductor active layer 902. The third gate insulation layer 84 is disposed between the oxide semiconductor active layer 902 and the top-gate metal layer 93. The second interlayer insulation layer 85 is disposed between the top-gate metal layer 93 and the second metal layer 94. The protection insulation layer 86 and the first planarization layer 87 are disposed between the second metal layer 94 and the third metal layer 95. The second planarization layer 88 is disposed between the third metal layer 95 and the anode metal layer 96. The pixel defining layer 89 is disposed on the side of the anode metal layer 96 facing away from the substrate 1.

Specifically, as shown in FIG. 10, the first metal layer 91 may form the gate of a first-type thin-film transistor (for example, T6). In FIG. 10, the gate of the first-type thin-film transistor may be reused as the lower plate of a storage capacitor Cst. The capacitor plate layer 92 may form the upper plate of the storage capacitor Cst and the bottom gate of a second-type thin-film transistor (for example, T2). The top-gate metal layer 93 may form the top gate of the second-type thin-film transistor. Thus, a double-gate thin-film transistor is formed. The anode metal layer 96 may form the anode of the light emission element 3. The third metal layer 95 may form a connection structure between the anode and the thin-film transistor.

It is to be noted that, for ease of differentiation, the insulation layers and the metal layers in corresponding embodiments are identified by using different reference numerals in FIG. 10 (FIG. 12) and FIG. 6 (FIG. 8).

In the preceding insulation layers, the first gate insulation layer 81, the first interlayer insulation layer 82, the second gate insulation layer 83, the third gate insulation layer 84, the second interlayer insulation layer 85, and the protection insulation layer 86 are inorganic insulation layers. The first planarization layer 87, the second planarization layer 88, and the pixel defining layer 89 are organic insulation layers. Optionally, the inorganic insulation layers, that is, two adjacently disposed layers of the first gate insulation layer 81, the first interlayer insulation layer 82, the second gate insulation layer 83, the third gate insulation layer 84, the second interlayer insulation layer 85, and the protection insulation layer 86 are reused as the first light adjustment layer 21 and the second light adjustment layer 22. In this manner, the cost and the process difficulty can be reduced.

Figure 12:
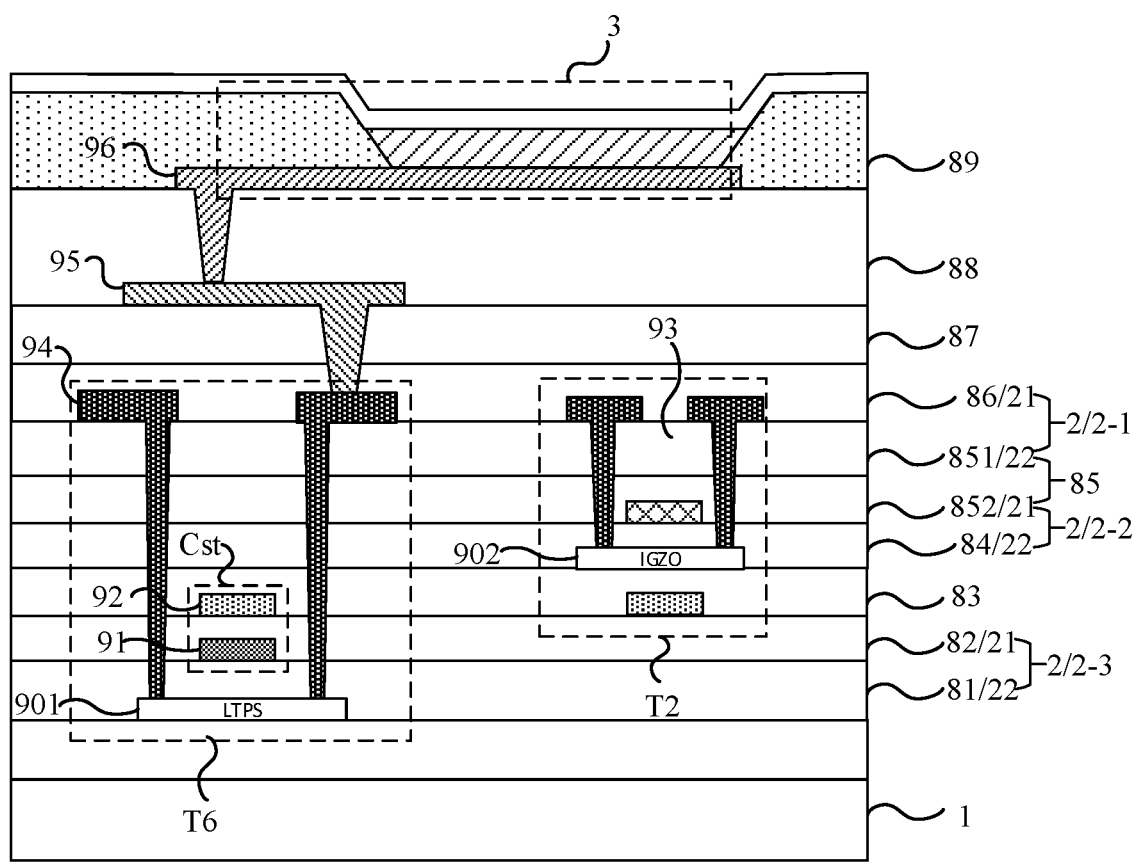
FIG. 12 is a partial cross-sectional view illustrating the structure of another display panel corresponding to FIG. 9.

Considering the factors such as the bonding between film layers and the refractive indices of film layers, the preceding inorganic insulation layers may be prepared by using a mixture of silicon oxide and silicon nitride. That is, the inorganic insulation layers include both silicon oxide and silicon nitride. Optionally, FIG. 12 is a partial cross-sectional view illustrating the structure of another display panel corresponding to FIG. 9. As shown in FIG. 9, optionally, the ratio of silicon oxide in the first gate insulation layer 81 is higher. The ratio of silicon nitride in the first interlayer insulation layer 82 is higher. The ratio of silicon oxide in the second gate insulation layer 83 is higher. The ratio of silicon oxide in the third gate insulation layer 84 is higher. The second interlayer insulation layer 85 includes a first sub-interlayer insulation layer 851 and a second sub-interlayer insulation layer 852 stacked sequentially. The first sub-interlayer insulation layer 851 is disposed closest to the protection insulation layer 86. The second sub-interlayer insulation layer 852 is disposed closest to the third gate insulation layer 84. The refractive index of the first sub-interlayer insulation layer 851 is less than the refractive index of the second sub-interlayer insulation layer 852. For example, the ratio of silicon nitride in the second sub-interlayer insulation layer 852 is higher. The ratio of silicon oxide in the first sub-interlayer insulation layer 851 is higher. The ratio of silicon nitride in the protection insulation layer 86 is higher.

Correspondingly, referring to FIG. 12, optionally, the protection insulation layer 86 is reused as the first light adjustment layer 21, and the first sub-interlayer insulation layer 851 is reused as the second light adjustment layer 22. Moreover/alternatively, the second sub-interlayer insulation layer 852 is reused as the first light adjustment layer 21, and the third gate insulation layer 84 is reused as the second light adjustment layer 22. Moreover/alternatively, the first interlayer insulation layer 82 is reused as the first light adjustment layer 21, and the first gate insulation layer 81 is reused as the second light adjustment layer 22. Thus, the display panel may include one to three light adjustment layers 2, such as light adjustment layers 2-1, 2-2, and 2-3 in FIG. 12. Those skilled in the art may select at least one of the light adjustment layers 2 according to requirements. By reasonably setting the refractive indices of the first light adjustment layer 21 and the second light adjustment layer 22 in the light adjustment layer 2, the light intensity emitted to one side of the substrate 1 is reduced, thereby reducing the light intensity reflected to thin-film transistors and improving the display uniformity.

Figure 13:
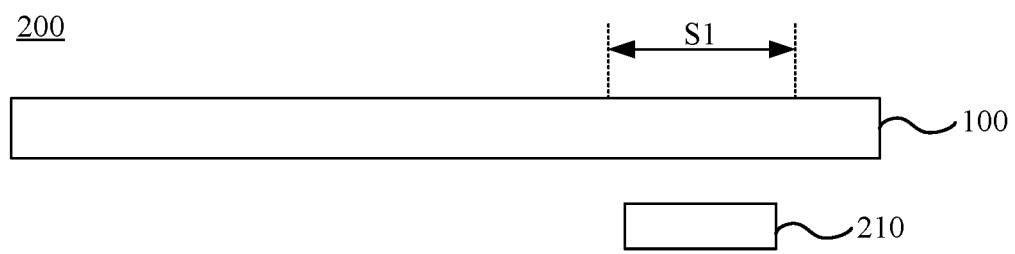
FIG. 13 is a diagram illustrating the structure of a display apparatus according to the embodiments of the present disclosure.

Based on the same concept, the embodiments of the present disclosure also provide a display apparatus. FIG. 13 is a diagram illustrating the structure of a display apparatus according to the embodiments of the present disclosure. As shown in FIG. 13, a display apparatus 200 includes a photosensitive element 210 and the display panel 100 provided in any of the preceding embodiments. The photosensitive element 210 is disposed corresponding to a first display region S1. Since the display apparatus 200 includes the display panel 100 provided in any of the preceding embodiments, the display apparatus 200 has the same beneficial effects as the preceding display panel. For the same, reference may be made to the preceding description of the display panel in the embodiments, and details are not repeated herein. The display apparatus 200 provided in the embodiments of the present disclosure may be any electronic product with a display function and optical functions (for example, camera shooting and fingerprint recognition), including but not limited to a phone, a television, a laptop, a desktop display, a tablet computer, a digital camera, a smart bracelet, a smart glass, a vehicle-mounted display, medical equipment, industrial control equipment, and a touch interactive terminal. No special limitations are made thereto in the embodiments of the present disclosure.

The preceding specific embodiments do not constitute a limitation on the protection scope of the present disclosure. It is to be understood by those skilled in the art that various modifications, combinations, sub-combinations, and substitutions may be performed according to design requirements and other factors. Any modifications, equivalent replacements, improvements, and the like within the spirit and principle of the present disclosure shall fall within the protection scope of the present disclosure.

What is claimed is:

1. A display panel, comprising a first display region and a second display region, wherein a light transmittance of the first display region is greater than a light transmittance of the second display region; and
wherein the display panel further comprises:
a substrate; and
at least one light adjustment layer disposed on one side of the substrate, wherein each of the at least one light adjustment layer comprises a first light adjustment layer and a second light adjustment layer, the first light adjustment layer is disposed on one side of the second light adjustment layer facing away from the substrate, and a refractive index of the first light adjustment layer is greater than a refractive index of the second light adjustment layer;
wherein the display panel further comprises: a support layer disposed on one side of the substrate facing away from the at least one light adjustment layer, wherein the support layer comprises a light-passing hole, and an orthographic projection of the light-passing hole on the substrate overlaps an orthographic projection of the first display region on the substrate.

2. The display panel according to claim 1, wherein the first light adjustment layer and the second light adjustment layer are inorganic insulation layers.

3. The display panel according to claim 2, wherein a material of the first light adjustment layer includes silicon nitride, and a material of the second light adjustment layer includes silicon oxide.

4. The display panel according to claim 1, further comprising: a pixel circuit layer and a light emission unit layer; wherein the pixel circuit layer is disposed between the substrate and the light emission unit layer, the pixel circuit layer comprises a pixel driver circuit, the light emission unit layer comprises a light emission element, and the pixel driver circuit is configured to drive the light emission element to emit light; and
wherein each of the pixel circuit layer and the light emission unit layer comprises at least one insulation layer, and two adjacent insulation layers are reused as the first light adjustment layer and the second light adjustment layer in a one-to-one manner along a direction perpendicular to a plane in which the substrate is located.

5. The display panel according to claim 4, wherein the pixel driver circuit comprises at least two thin-film transistors, and each of the at least two thin-film transistors comprises a polysilicon active layer.

6. The display panel according to claim 5, wherein along a direction in which the substrate points toward the light emission element, the display panel comprises: a gate insulation layer, a first interlayer insulation layer, a second interlayer insulation layer, a protection insulation layer, a first planarization layer, a second planarization layer, and a pixel defining layer disposed in sequence on one side of the substrate, wherein
two adjacently disposed layers of the following layers are reused as the first light adjustment layer and the second light adjustment layer in a one-to-one manner: the gate insulation layer, the first interlayer insulation layer, the second interlayer insulation layer, the protection insulation layer, the first planarization layer, the second planarization layer, and the pixel defining layer.

7. The display panel according to claim 6, wherein the second interlayer insulation layer comprises a first sub-interlayer insulation layer, and the first sub-interlayer insulation layer is disposed closest to the protection insulation layer; and
the protection insulation layer is reused as the first light adjustment layer, and the first sub-interlayer insulation layer is reused as the second light adjustment layer; or,
the first interlayer insulation layer is reused as the first light adjustment layer, and the gate insulation layer is reused as the second light adjustment layer.

8. The display panel according to claim 7, wherein the second interlayer insulation layer further comprises a second sub-interlayer insulation layer, the second sub-interlayer insulation layer is disposed on one side of the first sub-interlayer insulation layer facing the substrate, and a refractive index of the second sub-interlayer insulation layer is greater than a refractive index of the first sub-interlayer insulation layer.

9. The display panel according to claim 6, further comprising a first metal layer, a capacitor plate layer, a second metal layer, a third metal layer, and an anode metal layer which are disposed on one side of the substrate, wherein
the gate insulation layer is disposed between the polysilicon active layer and the first metal layer, the first interlayer insulation layer is disposed between the first metal layer and the capacitor plate layer, and the second interlayer insulation layer is disposed between the capacitor plate layer and the second metal layer;
the protection insulation layer and the first planarization layer are disposed between the second metal layer and the third metal layer, the second planarization layer is disposed between the third metal layer and the anode metal layer, and the pixel defining layer is disposed on one side of the anode metal layer facing away from the substrate.

10. The display panel according to claim 4, wherein the pixel driver circuit comprises a first-type thin-film transistor and a second-type thin-film transistor, the first-type thin-film transistor comprises a polysilicon active layer, and the second-type thin-film transistor comprises an oxide semiconductor active layer.

11. The display panel according to claim 10, wherein along a direction in which the substrate points toward the light emission element, the display panel comprises: a first gate insulation layer, a first interlayer insulation layer, a second gate insulation layer, a third gate insulation layer, a second interlayer insulation layer, a protection insulation layer, a first planarization layer, a second planarization layer, and a pixel defining layer disposed in sequence on one side of the substrate, wherein the first light adjustment layer and the second light adjustment layer are reused as two adjacently disposed layers of the following layers are reused as the first light adjustment layer and the second light adjustment layer in a one-to-one manner: the first gate insulation layer, the first interlayer insulation layer, the second gate insulation layer, the third gate insulation layer, the second interlayer insulation layer, the protection insulation layer, the first planarization layer, the second planarization layer, and the pixel defining layer.

12. The display panel according to claim 11, wherein the second interlayer insulation layer comprises a first sub-interlayer insulation layer and a second sub-interlayer insulation layer stacked sequentially, the first sub-interlayer insulation layer is disposed closest to the protection insulation layer, the second sub-interlayer insulation layer is disposed closest to the third gate insulation layer, and a refractive index of the first sub-interlayer insulation layer is less than a refractive index of the second sub-interlayer insulation layer; and the protection insulation layer is reused as the first light adjustment layer, and the first sub-interlayer insulation layer is reused as the second light adjustment layer; or, the second sub-interlayer insulation layer is reused as the first light adjustment layer, and the third gate insulation layer is reused as the second light adjustment layer; or, the first interlayer insulation layer is reused as the first light adjustment layer, and the first gate insulation layer is reused as the second light adjustment layer.

13. The display panel according to claim 11, further comprising a first metal layer, a capacitor plate layer, a top-gate metal layer, a second metal layer, a third metal layer, and an anode metal layer, wherein the first gate insulation layer is disposed between the polysilicon active layer and the first metal layer, the first interlayer insulation layer is disposed between the first metal layer and the capacitor plate layer, the second gate insulation layer is disposed between the capacitor plate layer and the oxide semiconductor active layer, and the third gate insulation layer is disposed between the oxide semiconductor active layer and the top-gate metal layer;

the second interlayer insulation layer is disposed between the top-gate metal layer and the second metal layer, the protection insulation layer and the first planarization layer are disposed between the second metal layer and the third metal layer, the second planarization layer is disposed between the third metal layer and the anode metal layer; and the pixel defining layer is disposed on one side of the anode metal layer facing away from the substrate.

14. The display panel according to claim 1, further comprising a light emission unit layer and a touch layer which are disposed on one side of the at least one light adjustment layer facing away from the substrate, wherein the light emission unit layer comprises a plurality of light emission elements, the touch layer comprises a plurality of touch electrodes, orthographic projections of the plurality of touch electrodes on the substrate do not overlap orthographic projections of the plurality of light emission elements on the substrate, and the plurality of touch electrodes are not light-transmissive.

15. The display panel according to claim 1, wherein the first display region is a camera region or a fingerprint recognition region.

16. The display panel according to claim 1, wherein the first light adjustment layer comprises a first light emitting segment disposed in the first display region and a third light emitting segment disposed in the second display region, the second light adjustment layer comprises a second light emitting segment disposed in the first display region and a fourth light emitting segment disposed in the second display region, and a refractive index difference between the first light emitting segment and the second light emitting segment is greater than a refractive index difference between the third light emitting segment and the fourth light emitting segment.

17. A display apparatus, comprising a photosensitive element and a display panel;

wherein the display panel comprises: a first display region and a second display region, wherein a light transmittance of the first display region is greater than a light transmittance of the second display region; and wherein the display panel further comprises:

a substrate; and at least one light adjustment layer disposed on one side of the substrate, wherein each of the at least one light adjustment layer comprises a first light adjustment layer and a second light adjustment layer, the first light adjustment layer is disposed on one side of the second light adjustment layer facing away from the substrate, and a refractive index of the first light adjustment layer is greater than a refractive index of the second light adjustment layer;

wherein the photosensitive element is disposed corresponding to the first display region;

wherein the display panel further comprises: a support layer disposed on one side of the substrate facing away from the at least one light adjustment layer, wherein the support layer comprises a light-passing hole, and an orthographic projection of the light-passing hole on the substrate overlaps an orthographic projection of the first display region on the substrate.

\* \* \* \* \*